United States Patent [19]
Ueyama et al.

[11] Patent Number: 6,160,741
[45] Date of Patent: Dec. 12, 2000

[54] NON-VOLATILE SEMICONDUCTOR MEMORY DEVICE AND ERASING METHOD FOR SAID DEVICE

[75] Inventors: Takayuki Ueyama; Takanobu Oda, both of Kawasaki, Japan

[73] Assignee: Fujitsu Limited, Kawasaki, Japan

[21] Appl. No.: 09/459,579

[22] Filed: Dec. 13, 1999

[30]  Foreign Application Priority Data

Dec. 28, 1998 [JP] Japan .................................. 10-371765

[51] Int. Cl.⁷ .................................................. G11C 16/10
[52] U.S. Cl. .............................. 365/185.33; 365/185.29; 365/185.11
[58] Field of Search ......................... 365/185.29, 185.33, 365/185.11, 185.23

[56]  References Cited

U.S. PATENT DOCUMENTS 4,980,861  12/1990  Herdt et al. ............................. 365/203

FOREIGN PATENT DOCUMENTS

| 1-23878 | 5/1989 | Japan | G11C 11/34 |
| 1-46949 | 10/1989 | Japan | G11C 11/34 |
| 7-114500 | 5/1995 | Japan | G11C 16/06 |

*Primary Examiner*—Andrew Q. Tran
*Attorney, Agent, or Firm*—Arent Fox Kintner Plotkin & Kahn, PLLC

[57]  ABSTRACT

An electrically erasable and writable non-volatile semiconductor memory device having a function of collectively erasing a plurality of memory blocks selected as erase object memory blocks is provided. A logic circuit and an output buffer circuit constitute an erase object memory block selection notifying circuit, which outputs an erase object memory block selection notifying signal indicating whether designated memory blocks have been selected as erase object memory blocks or not, in synchronization with an output enable signal supplied from the CPU. Thus, the erasing operation mode period in the non-volatile semiconductor memory device can be shortened.

7 Claims, 9 Drawing Sheets

NON-VOLATILE SEMICONDUCTOR MEMORY DEVICE AND ERASING METHOD FOR SAID DEVICE

BACKGROUND OF THE INVENTION

1. Field of the Invention

The present invention generally relates to non-volatile semiconductor memory devices, and more particularly, to a non-volatile semiconductor memory device comprising a plurality of memory blocks in which electrically erasable and writable non-volatile memory cells are arranged, the device having a function of collectively erasing memory blocks selected as erase object memory blocks. The present invention also relates to a method of performing an erasing operation in such a non-volatile semiconductor memory device.

In an erasing operation mode, such a non-volatile semiconductor memory device starts an erasing operation upon receipt of a first memory block address signal and an erase command signal from an address and command signal transmitter. After a timeout period comes to an end, an erasing operation is collectively performed for memory blocks selected as erase object memory blocks.

2. Description of the Related Art

FIG. 1 is a block circuit diagram showing the structure of an example of a non-volatile semiconductor memory device of the prior art. In this figure, reference numeral 1 indicates the non-volatile semiconductor memory device, reference numerals 2-0, 2-1, and 2-n indicate memory blocks each having electrically erasable and writable non-volatile memory cells, such as flash memory. Memory blocks 2-2 to 2-(n−1) existing between the memory blocks 2-1 and 2-n are not shown in the figure. Reference numeral 3 indicates an address latch circuit which latches a memory block address signal supplied from an address and command signal transmitter such as CPU. Reference numeral 4 indicates a block decoder which decodes the memory block address signal latched by the address latch circuit 3 so as to select memory blocks to be designated as erase object memory blocks by the memory block address signal.

Reference numerals 5-0, 5-1, and 5-n indicate block latch circuits corresponding to the memory blocks 2-0, 2-1, and 2-n, respectively. Each of the block latch circuits latches information on whether each corresponding memory block has been selected as an erase object memory block. Block latch circuits 5-2 to 5-(n−1) corresponding to the memory blocks 2-2 to 2-(n−1) are not shown in this figure.

Reference numeral 6 indicates a timer which outputs "1" before a start-up, and outputs "0" during the timeout period when started or reset. After the timeout period comes to an end, the timer 6 again outputs "1". Reference numeral 7 indicates a control circuit which receives an erase command signal, a write enable signal /WE, and a chip enable signal /CE, and which controls a latching process of the erase command signal, the address latch circuit 3, and the timer 6. The control circuit 7 controls the address latch circuit 3 to latch a memory block address signal at the timing of falling of the write enable signal /WE or the chip enable signal /CE, whichever is the later signal. The control circuit 7 also latches an erase command signal and starts or resets the timer 6 at the timing of rising of the write enable signal /WE or the chip enable signal /CE, whichever is the earlier signal.

In the above conventional non-volatile semiconductor memory device in the erasing operation mode, an erasing operation is collectively performed for memory blocks selected by the block decoder 4 and selected as erase object memory blocks by the block latch circuits 5-0 to 5-n.

FIG. 2 is a timing chart of an example operation of the conventional non-volatile semiconductor memory device of FIG. 1 in an erasing operation mode. In this example operation, the CPU first supplies a memory block address signal for designating the memory block 2-0. After the chip enable signal /CE falls, the write enable signal /WE falls. Here, the address latch circuit 3 latches the memory block address signal for designating the memory block 2-0 at a timing T1 when the write enable signal /WE falls. The block decoder 4 then decodes the memory block address signal latched by the address latch circuit 3 so as to select the memory block 2-0 as an erase object block memory. The block latch circuit 5-0 latches "0" as the information indicating that the memory block 2-0 has been selected. The control circuit 7 then latches an erase command signal (30H) and starts the timer 6 at a timing T2 when the write enable signal /WE rises. As a result, the output S6 of the timer 6 changes from "1" to "0", notifying the CPU that a timeout period during which an additional memory block address signal and an erase command signal can be inputted has started.

The memory block address signal for designating the memory block 2-0 is then followed by a memory block address signal for designating the memory block 2-1 as an erase object memory block, together with an erase command signal. The address latch circuit 3 latches the memory block address signal for designating the memory block 2-1 at a timing T3 when the write enable signal /WE falls. The block decoder 4 decodes the memory block address signal latched by the address latch circuit 3 so as to select the memory block 2-1 as an erase object memory block. The block latch circuit 5-1 latches "0" as the information indicating that the memory block 2-1 has been selected. The control circuit 7 then latches an erase command signal and resets the timer 6 at a timing T4 when the write enable signal /WE rises, thereby updating the timeout period. Thereafter, every time a memory block address signal and an erase command signal are supplied from the CPU during the timeout period, the latching of the memory block address signal and the erase command signal, and the resetting of the timer 6 are repeated. When the timeout period comes to an end, an erasing operation is collectively performed for the memory blocks selected as the erase object memory blocks.

FIG. 3 shows an example operation of the CPU which transmits address signals and command signals in the non-volatile semiconductor memory device of FIG. 1 in the erasing operation mode. It should be understood here that a step S8-5 is an operation by the non-volatile semiconductor memory device.

In the erasing operation mode, the CPU first supplies a memory block address signal and an erase command signal to the non-volatile semiconductor device, thereby performing a first memory block address and erase command writing operation in a step S8-1. When the control circuit 7 latches the erase command signal, the timer 6 is started, indicating that the timeout period, during which an additional memory block address and erase command writing operation can be performed, has started. If there is an additional memory block address, the CPU judges whether it is during the timeout period or not in a step S8-2. If it is during the timeout period, the CPU supplies the additional memory block address signal and the erase command signal to the non-volatile semiconductor memory device, thereby performing the additional memory block address and erase command writing operation in a step S8-3. Here, the CPU judges whether there is an additional memory block or not in a step S8-4. As long as there is an additional memory block, the steps S8-2 and S8-3 are repeated. When the timeout period comes to an end ("NO" in the step S8-2), an erasing operation is collectively performed for memory blocks selected as erase object memory blocks in a step S8-5, thereby ending the erasing operation mode.

With the conventional non-volatile semiconductor memory device of FIG. 1, however, there are several problems described below. For instance, the conventional non-volatile semiconductor memory device is not provided with a means for notifying the CPU whether a memory block designated by the CPU as an erase object memory block has been actually selected or not, i.e., whether the information for indicating the memory block selected by the block decoder 4 as an erase object memory block has been latched by the corresponding block latch circuit or not. Because of this, the CPU needs to perform an operation shown in FIG. 4 so as to check whether a memory block designated as an erase object memory block has been actually selected in the conventional non-volatile semiconductor memory device. As shown in FIG. 4, after the erasing operation in the non-volatile semiconductor memory device of FIG. 1, the CPU reads all the addresses in all memory blocks designated as erase object memory blocks in a step S8-6, so as to judge whether all the data is "1" or not in a step S8-7. If there is a memory block which has not been selected as an erase object memory block due to noise or the like, the CPU performs a memory block address and erase command writing operation for the memory block, so that the non-volatile semiconductor memory device of FIG. 1 performs another erasing operation. These processes result in a considerably long erasing operation time.

SUMMARY OF THE INVENTION

A general object of the present invention is to provide a non-volatile semiconductor memory device in which the above disadvantages are eliminated.

A more specific object of the present invention is to provide a non-volatile semiconductor memory device in which the period of time required for checking whether a memory block designated as an erase object memory block by an address and command signal transmitter has been actually selected as an erase object memory block can be shortened, and also in which the erasing operation time is shortened by eliminating the need to perform another erasing operation for a memory block which has not been selected as an erase object memory block. Another specific object of the present invention is to provide a method of performing an erasing operation in such a non-volatile semiconductor memory device.

The above objects of the present invention are achieved by a non-volatile semiconductor memory device comprising: a plurality of memory blocks in which electrically erasable and writable non-volatile memory cells are arranged; an erase object memory block selection circuit which selects memory blocks designated as erase object memory blocks by an address and command signal transmitter; and an erase object memory block selection notifying circuit which notifies the address and command signal transmitter whether the erase object memory block selection circuit has selected the memory blocks designated by the address and command signal transmitter or not, an erasing operation being performed for the memory blocks selected by the erase object memory block selection circuit.

Since this non-volatile semiconductor memory device is provided with the erase object memory block selection notifying circuit, the address and command signal transmitter can recognize whether each memory block designated as an erase object memory block has been selected or not prior to the erasing operation. When the address and command signal transmitter receives a notice indicating that a memory block designated as an erase object memory block has not been selected as an erase object memory block, the address and command signal transmitter can again designate the same memory block as an erase object memory block during the timeout period. Accordingly, after the erasing operation, the address and command signal transmitter does not need to read all the addresses in all memory blocks designated as erase object memory blocks to check whether the designated memory blocks have been selected as erase object memory blocks.

The objects of the present invention are also achieved by a method of performing an erasing operation in a non-volatile semiconductor memory device which comprises: a plurality of memory blocks in which electrically erasable and writable non-volatile memory cells are arranged; and an erase object memory block selection circuit which selects a memory block designated as an erase object memory block by an address and command signal transmitter, an erasing operation being performed for memory blocks selected by the erase object memory block selection circuit. This method comprises the step of notifying the address and command signal transmitter whether memory blocks designated by the address and command signal transmitter have been actually selected as erase object memory blocks.

Since this method includes the step of notifying, the address and command signal transmitter can check whether each memory block designated as an erase object memory block has been actually selected as an erase object memory block prior to an erase operation. When the address and command signal transmitter receives a notice indicating that a memory block designated as an erase object memory block has not been selected as an erase object memory block, the address and command signal transmitter can again designate the same memory block as an erase object memory block during the timeout period. Accordingly, after the erasing operation, the address and command signal transmitter does not need to read all the addresses in all memory blocks designated as erase object memory blocks to check whether the designated memory blocks have been selected as erase object memory blocks.

The above and other objects and features of the present invention will become more apparent from the following description taken in conjunction with the accompanying drawings.

DESCRIPTION OF THE PREFERRED EMBODIMENTS

The following is a description of embodiments of the present invention, with reference to the accompanying drawings.

Figure 1:
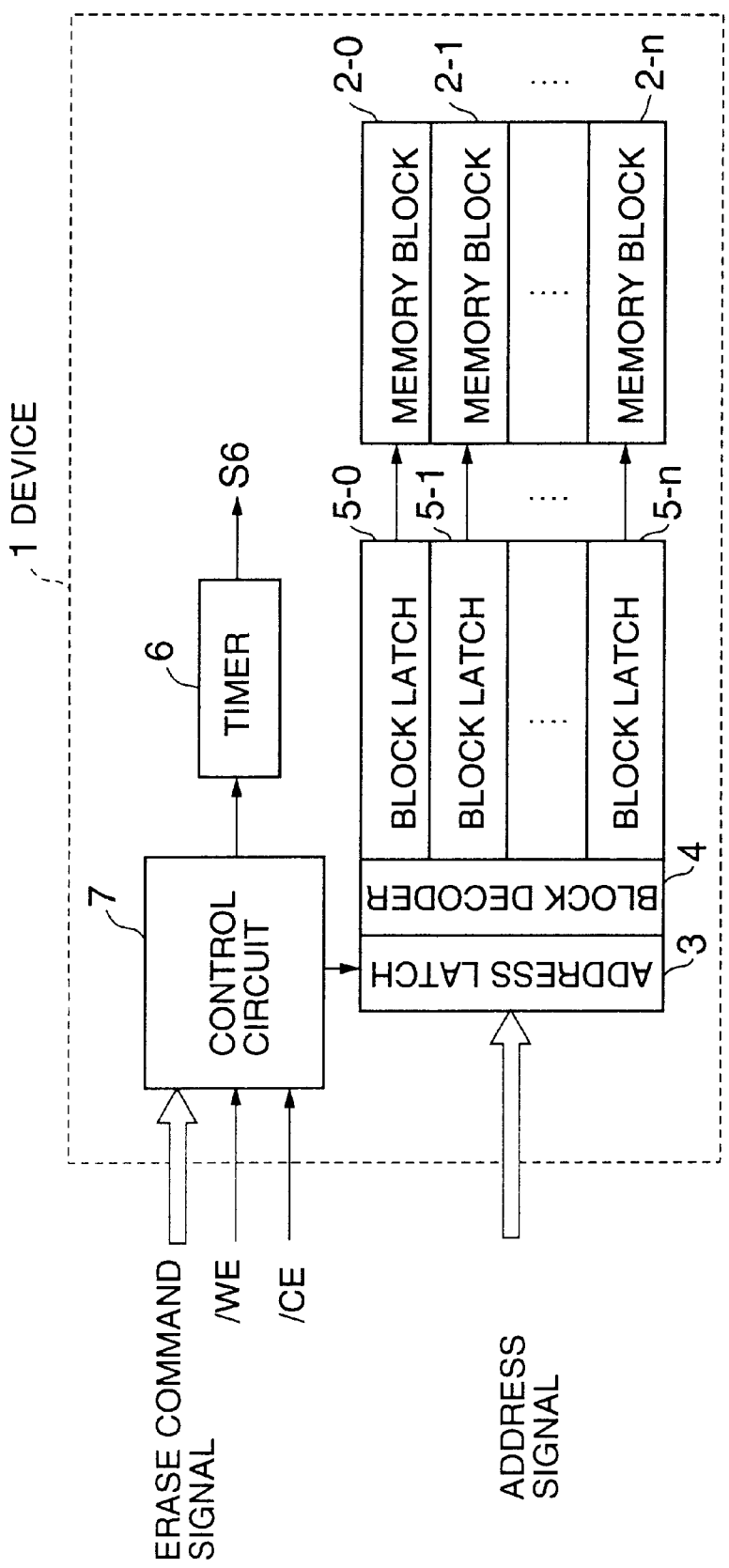
FIG. 1 is a block circuit diagram showing one example of a non-volatile semiconductor memory device of the prior art.
Figure 2:
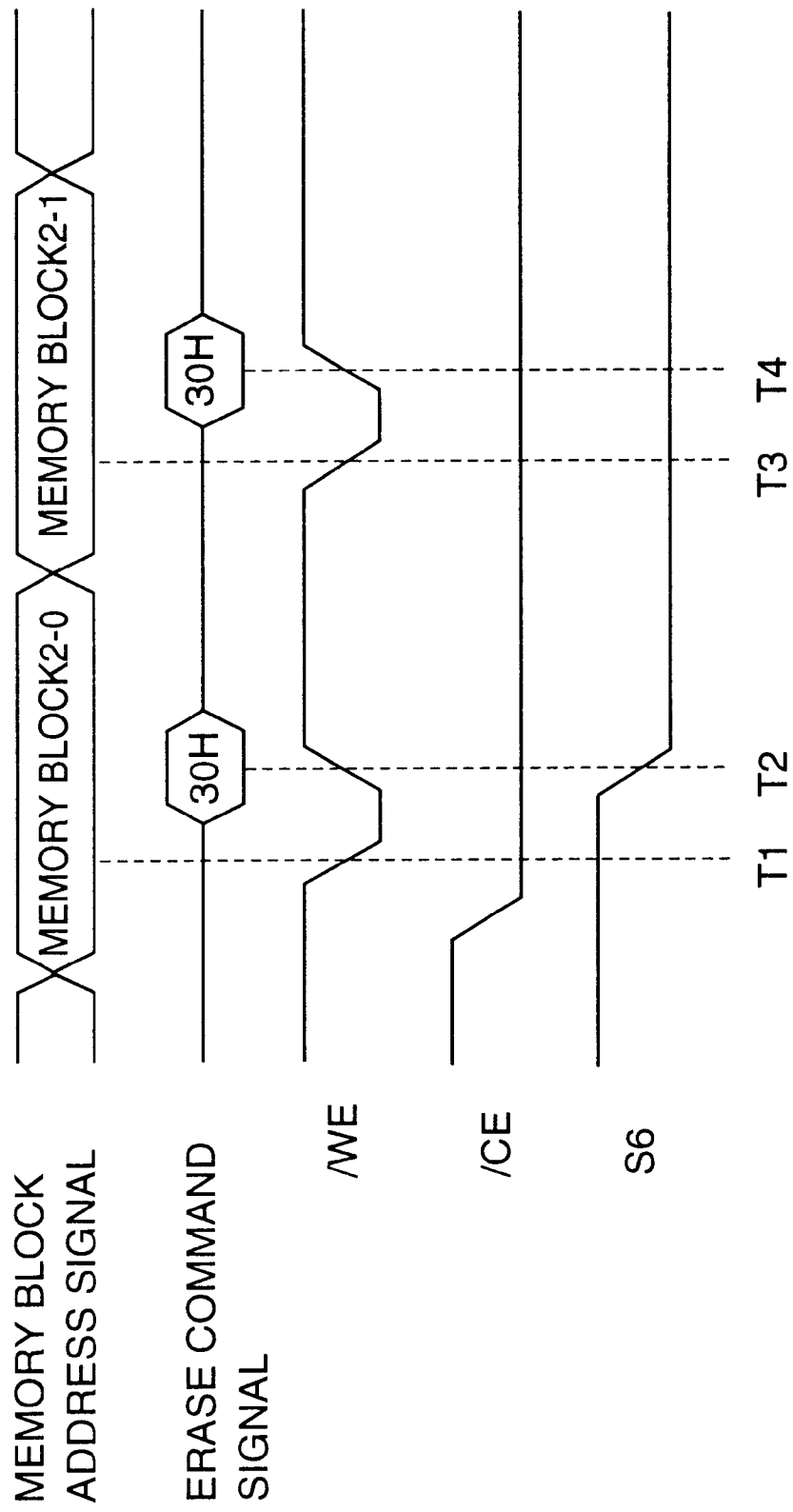
FIG. 2 is a timing chart of an example operation of the non-volatile semiconductor memory device of FIG. 1 in an erasing operation mode.
Figure 3:
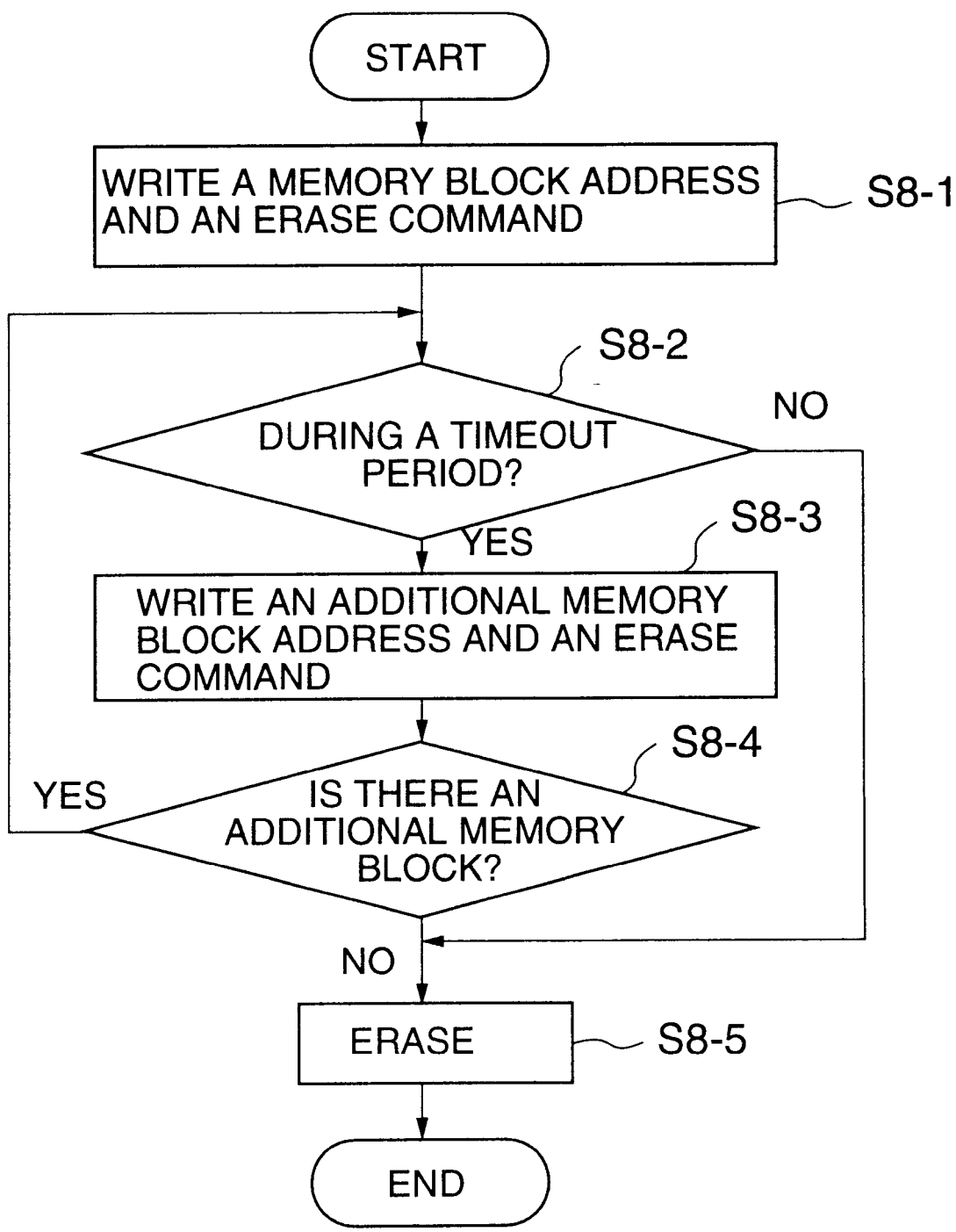
FIG. 3 is a flowchart of an operation of a CPU which transmits an address signal and a command signal in the non-volatile semiconductor memory device of FIG. 1 in the erasing operation mode.
Figure 4:
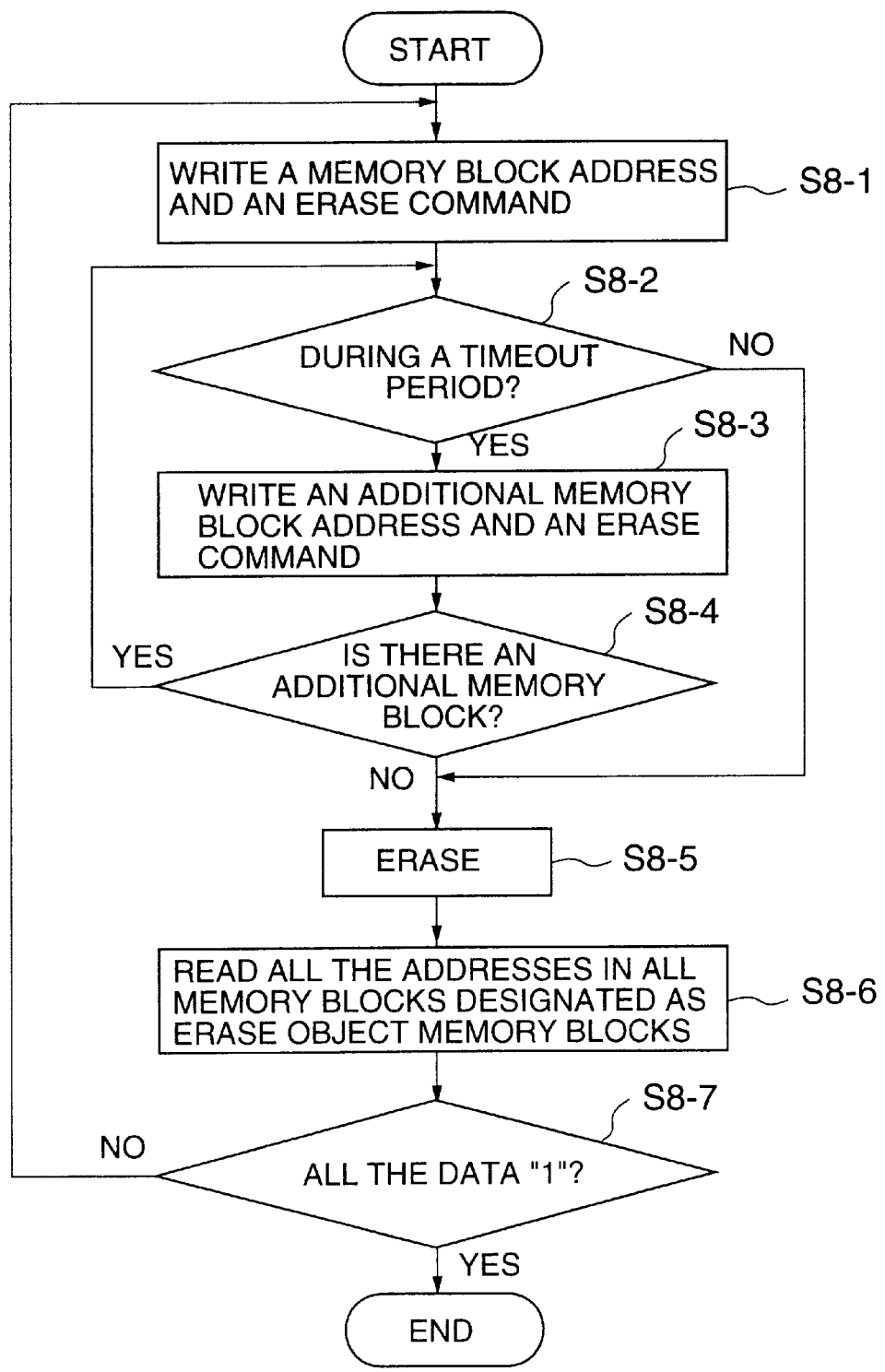
FIG. 4 is a flowchart showing problems in the non-volatile semiconductor memory device of FIG. 1.
Figure 5:
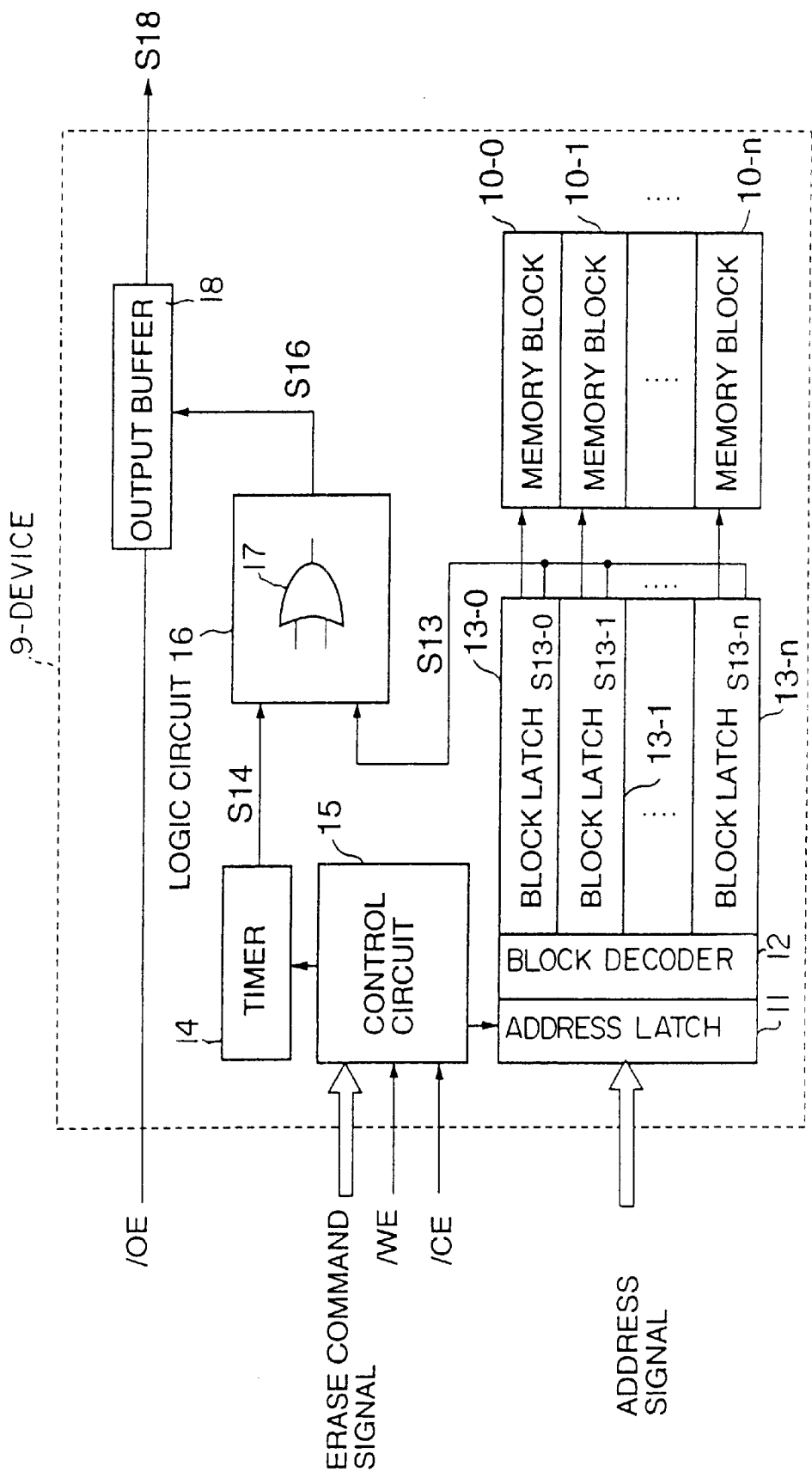
FIG. 5 is a block circuit diagram showing one embodiment of a non-volatile semiconductor memory device of the present invention.

FIG. 5 is a block circuit diagram of one embodiment of a non-volatile semiconductor memory device of the present invention. In this figure, reference numeral 9 indicates the non-volatile semiconductor memory device, and reference numerals 10-0, 10-1, and 10-n indicate memory blocks each containing non-volatile memory cells that are electrically erasable and writable, such as flash memories. Memory blocks 10-2 to 10-(n−1) existing between the memory blocks 10-1 and 10-n are not shown in this figure.

Reference numeral 11 indicates an address latch circuit which latches an address signals transmitted from an address signal and command signal transmitter such as CPU. Reference numeral 12 indicates a block decoder which decodes a memory block address signal latched by the address latch circuit 11, and selects a memory block designated by the memory block address signal as an erase object memory block.

Reference numerals 13-0, 13-1, and 13-n indicate block latch circuits which are disposed in correspondence with the memory blocks 10-0, 10-1, and 10-n, respectively, and latch information on whether each of the memory blocks 10-0, 10-1, and 10-n is designated as an erase object memory block by the block decoder 12. Block latch circuits 13-2 to 13-(n−1) corresponding to the memory blocks 10-2 to 10-(n−1) are not shown in this figure.

Here, a block latch circuit 13-i (i=0, 1, . . . n) latches "1" (level H) before a memory block 10-i is selected by the block decoder 12 as an erase object memory block. The block latch circuit 13-i latches "0" (level L) when the memory block 10-i is selected by the block decoder 12 as the erase object memory block. Also, the block latch circuit 13-i outputs a latch signal S13-i "1" or "0" as a memory block latch signal S13 to a logic circuit only when the block decoder 12 selects the memory block 10-i.

Reference numeral 14 indicates a timer which outputs "1" before start-up, outputs "0" during the timeout after start-up or reset, and again outputs "1" after the timeout.

Reference numeral 15 indicates a control circuit which receives an erase command signal, a write enable signal /WE, and a chip enable signal /CE, all of which are supplied from the CPU, and controls components such as the address latch circuit 11 and the timer 14. The control circuit 15 controls the address latch circuit 11 so as to latch the address signal at the time of falling of the write enable signal /WE or the chip enable signal /CE, whichever is the later signal.

Also, the control circuit 15 latches an erase command signal at the time of rising of the write enable signal /WE or the chip enable signal /CE, whichever is the earlier signal. The control circuit 15 also starts or resets the timer 14.

Reference numeral 16 indicates a logic circuit which constitutes an erase object memory block selection judgement circuit which logically processes the output S14 of the timer 14 and the memory block latch signal S13 to generate an erase object memory block selection judgement signal S16. The logic circuit 16 outputs "0" as the erase object memory block selection judgement signal S16 when the output S14 of the timer 14 and the memory block latch signal S13 are both "0". In any other case, the logic circuit 16 outputs "1" as the erase object memory block selection judgement signal S16. An OR circuit 17, for instance, constitutes the logic circuit 16.

Reference numeral 18 indicates an output buffer circuit which outputs the erase object memory block selection judgement signal S16 as an erase object memory block selection notifying signal S18 when an output enable signal /OE supplied from the CPU becomes "0". The logic circuit 16 and the output buffer circuit 18 constitute an erase object memory block selection notifying circuit. Here, an output pin for outputting the erase object memory block selection notifying signal S18 can be a conventional one, and there is no need to employ a new output pin.

Figure 6:
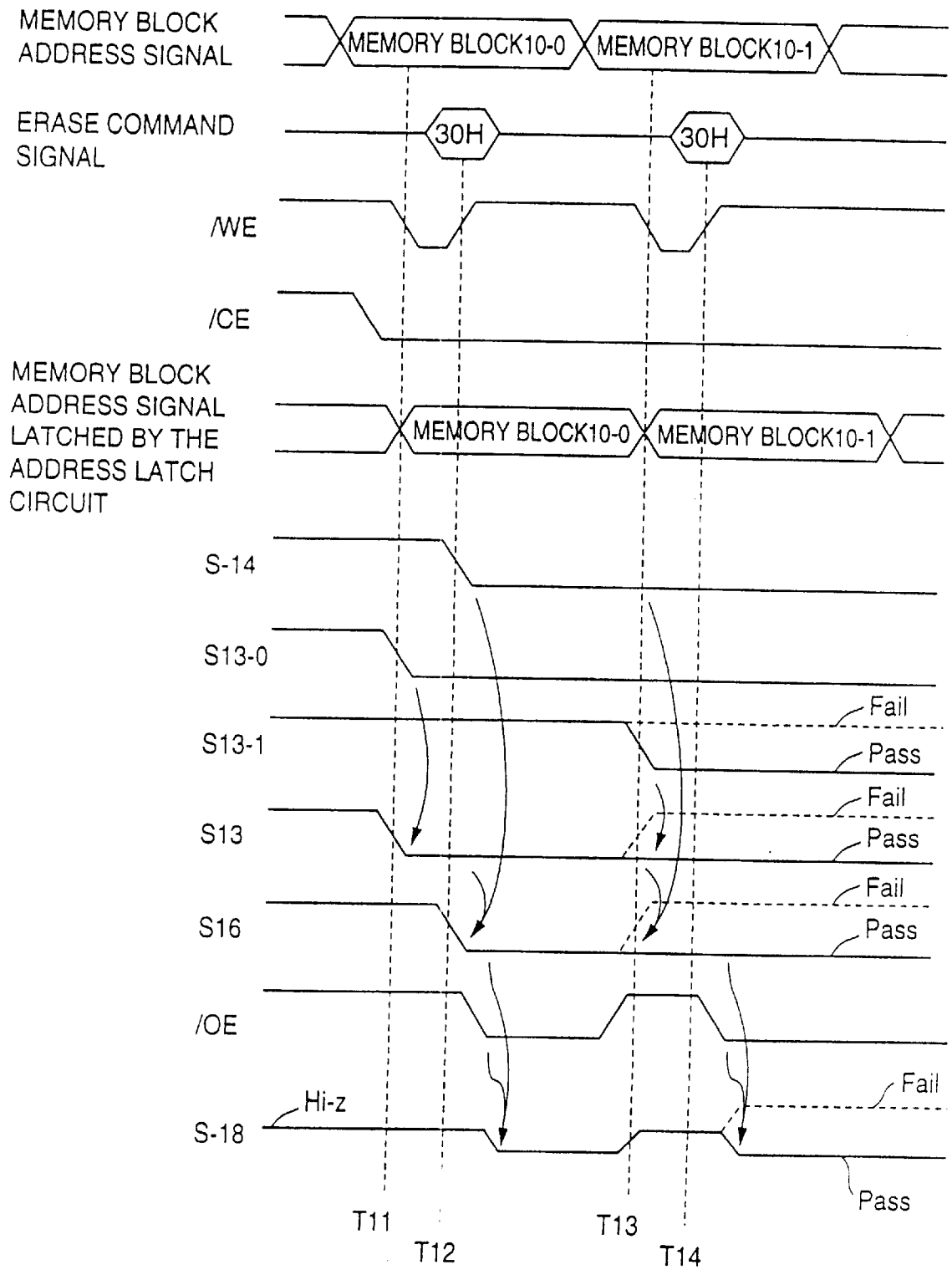
FIG. 6 is a timing chart of a first example operation of a non-volatile semiconductor memory device of the present invention in an erasing operation mode.

FIG. 6 is a timing chart of a first example operation of one embodiment of the non-volatile semiconductor memory device of the present invention in an erasing operation mode. In this example operation, a memory block address signal for designating the memory block 10-0 is supplied as a first memory block address signal from the CPU. After the chip enable signal /CE first falls, the write enable signal /WE falls. Here, the address latch circuit 11 latches the memory block address signal for designating the memory block 10-0 at a timing T11 when the write enable signal /WE falls. The block decoder 12 then decodes the memory block address signal latched by the address latch circuit 11 so as to select the memory block 10-0 as the erase object memory block. If the block latch circuit 13-0 latches the information "0" selected by the block decoder 12 here, the latch signal S13-0 "0" of the block latch circuit 13-0 is supplied as the memory block latch signal S13 to the logic circuit 16.

The control circuit 15 then latches the erase command signal (30H) at a timing T12 when the write enable signal /WE rises, and starts the timer 14. As a result of this, the output S14 of the timer 14 becomes "0", indicating that a timeout period during which a memory block address signal and an erase command signal can be additionally inputted has started. Here, "0" as the memory block latch signal S13 and "0" as the output S14 of the timer 14 are supplied to the logic circuit 16, so that the erase object memory block selection judgement signal S16 becomes "0". As the output enable signal /OE supplied from the CPU becomes "0", the erase object memory block selection notifying signal S18 synchronously becomes "0". Thus, the CPU can recognize that the memory block 10-0 has been actually selected as an erase object memory block.

Also, in this example operation, the memory block address signal for designating the memory block 10-0 is followed by a memory block address signal for designating the memory block 10-1 as an erase object memory block and an erase command signal. Here, the address latch circuit 11 latches the memory block address signal for designating the memory block 10-1 at a timing T13 when the write enable signal /WE falls. The block decoder 12 then decodes the memory block address signal latched by the address latch circuit 11 so as to select the memory block 10-1 as an erase object memory block. If the block latch circuit 13-1 latches the information "0" selected by the block decoder 12 here, the latch signal S13-1 "0" of the block latch circuit 13-1 is supplied as the memory block latch signal S13 to the logic circuit 16.

The control circuit 15 then latches the erase command signal (30H) and resets the timer 14 at a timing T14 when the write enable signal /WE rises. As a result, the output S14 of the timer 14 maintains "0", and the timeout period, during which an additional memory block address signal and an erase command signal can be inputted, is updated. Here, "0" as the memory block latch signal S13 and "0" as the output S14 of the timer 14 are supplied to the logic circuit 16, so that the erase object memory block selection judgement signal S16 becomes "0". As a result, when the output enable signal /OE supplied from the CPU becomes "0", the erase object memory block selection notifying signal S18 becomes "0". Thus, the CPU can recognize that the memory block 10-1 has been actually selected as an erase object memory block.

After the above procedures, every time a memory block address signal and an erase command signal are added by the CPU during the timeout period, the additional memory block address signal and the erase command signal are latched, and the timer 14 is reset. When the timeout period comes to an end, an erasing operation is collectively performed for the memory blocks selected as the erase object memory blocks.

Figure 7:
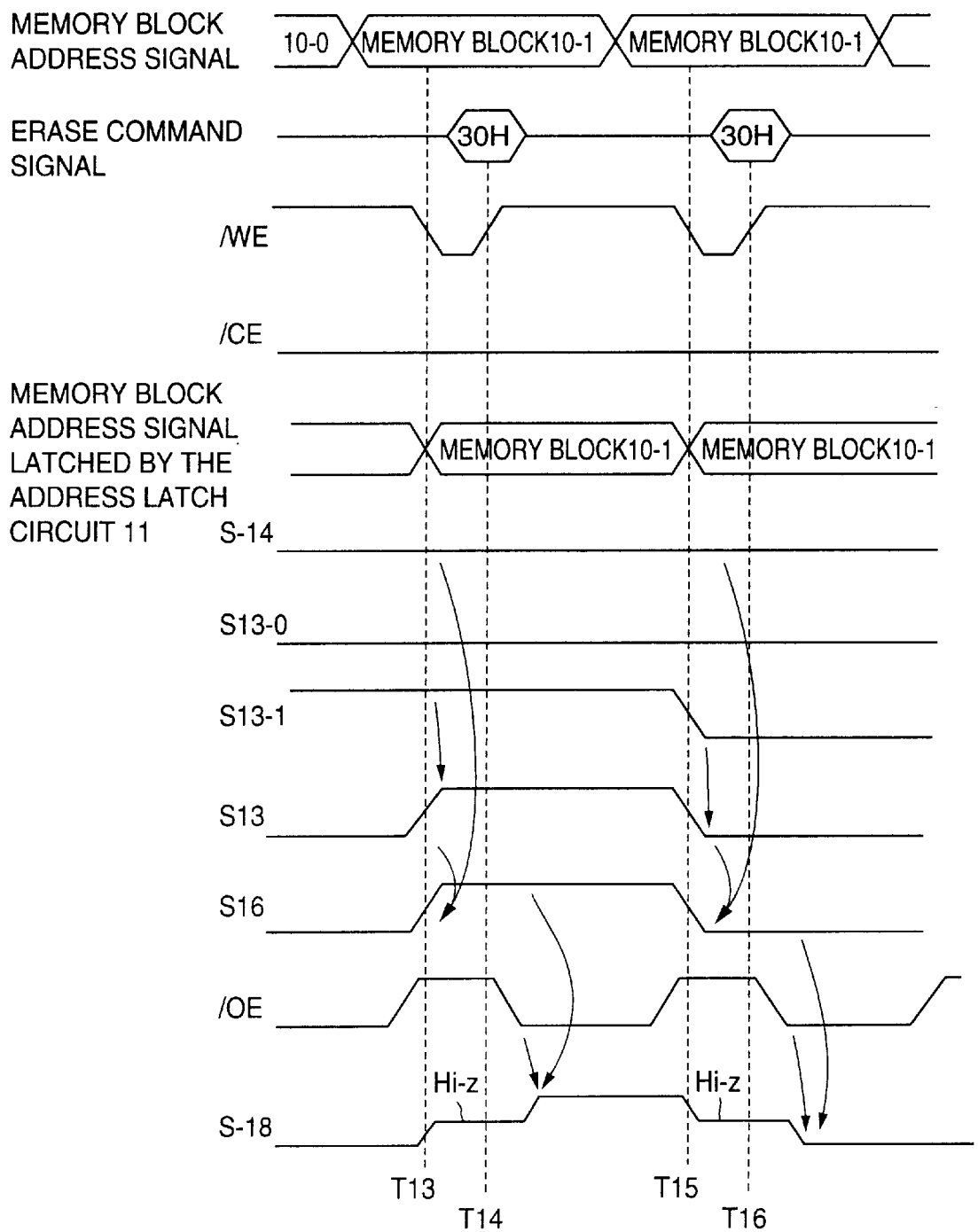
FIG. 7 is a timing chart showing a second example operation of a non-volatile semiconductor memory device of the present invention in an erasing operation mode.

FIG. 7 is a timing chart of a second example operation of one embodiment of the non-volatile semiconductor memory device of the present invention in an erasing operation mode. This example operation shows a case where the additional memory block 10-1 shown in FIG. 6 is not selected in a first writing operation, but is selected in a second writing operation.

The block decoder 12 decodes the memory block address signal for designating the memory block 10-1 so as to select the memory block 10-1 as an erase object memory block. If the block latch circuit 13-1 does not latch the information "0" selected by the block decoder 12 here due to noise or the like, "1" already latched as the latch signal S13-1 of the block latch circuit 13-1 is supplied as the memory block latch signal S13 to the logic circuit 16.

The control circuit 15 then latches the erase command signal (30H) and resets the timer 14 at the timing T14 when the write enable signal /WE rises. As a result, the output S14 of the timer 14 maintains "0", and the timeout period, during which an additional memory block address signal and erase command address can be inputted, is updated. Here, "1" as the memory block latch signal S13 and "0" as the output S14 of the timer 14 are supplied to the logic circuit 16, so that the erase object memory block selection judgement signal S16 becomes "1". As a result, when the output enable signal /OE supplied from the CPU becomes "0", the erase object memory block selection notifying signal S18 becomes "1". Thus, the CPU can recognize that the memory block 10-1 has not been actually selected as an erase object memory block.

In this example operation, the CPU can again input a memory block address signal for designating the memory block 10-1 and an erase command signal into one embodiment of the non-volatile semiconductor memory device of the present invention. The address latch circuit 11 then latches the memory block address signal for designating the memory block 10-1 at a timing T15 when the write enable signal /WE falls. The block decoder 12 decodes the memory block address signal latched by the address latch circuit 11 so as to select the memory block 10-1 as an erase object memory block. If the block latch circuit 13-1 latches the information "0" selected by the block decoder 12 here, the latch signal S13-1 "0" of the block latch circuit 13-1 is supplied as the memory block latch signal S13 to the logic circuit 16.

The control circuit 15 then latches the erase command signal (30H) and resets the timer 14 at a timing T16 when the write enable signal /WE rises. As a result, the output S14 of the timer 14 maintains "0", and the timeout period, during which an additional memory block address signal and erase command signal can be inputted, is updated. Here, "0" as the memory block latch signal S13 and "0" as the output S14 of the timer 14 are supplied to the logic circuit 16, so that the erase object memory block selection judgement signal S16 becomes "0". As a result, when the output enable signal /OE supplied from the CPU becomes "0", the erase object memory block selection notifying signal S18 becomes "0". Thus, the CPU can recognize that the memory block 10-1 has been actually selected as an erase object memory block.

After the above procedures, every time a memory block address signal and an erase command signal are added by the CPU during the timeout period, the additional memory block address signal and the erase command signal are latched, and the timer 14 is reset. When the timeout period comes to an end, an erasing operation is collectively performed for the memory blocks selected as the erase object memory blocks.

Figure 8:
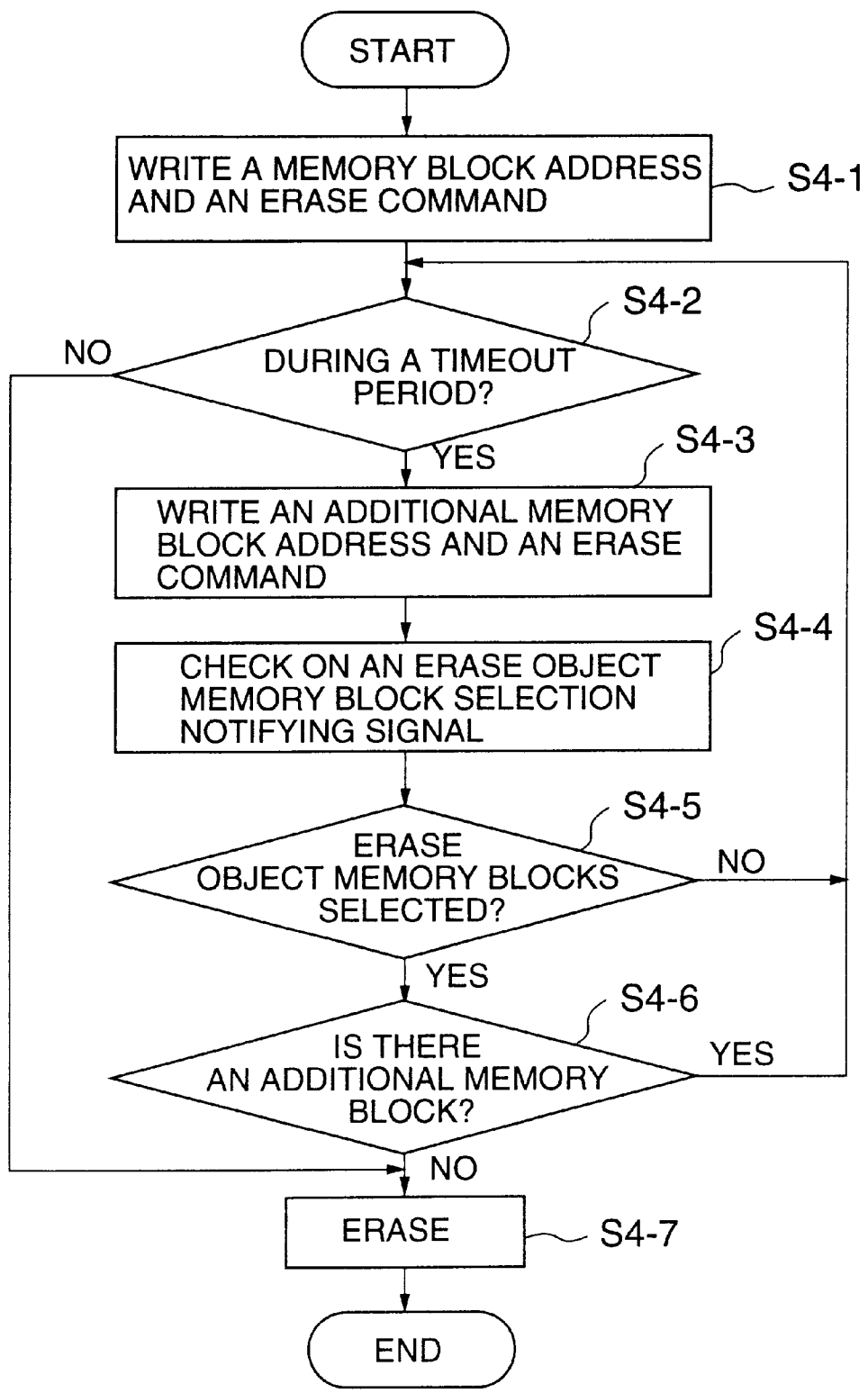
FIG. 8 is a flowchart of a first example operation of a CPU which transmits an address signal and a command signal in a non-volatile semiconductor memory device of the present invention in an erasing operation mode.

Accordingly, the CPU in the erasing operation mode operates as shown in FIG. 8.

In the erasing operation mode, the CPU first supplies a memory block address signal and an erase command signal to the non-volatile semiconductor memory device of the present invention, thereby performing a first memory block address and erase command writing operation in a step S4-1.

When the control circuit 15 latches the erase command signal, the timer 14 is started, indicating that a timeout period during which an additional memory block address and erase command writing operation can be performed has started. If there is an additional memory block address, the CPU judges whether it is in the timeout period or not in a step S4-2. If it is, the CPU supplies the additional memory block address signal and erase command signal to the non-volatile semiconductor device, thereby performing the additional memory block address and erase command writing operation in a step S4-3.

The CPU then checks on the erase object memory block selection notifying signal S18 outputted from the non-volatile semiconductor memory device in a step S4-4, and then judges whether the erase object memory block has been selected or not in a step S4-5. If it has been selected, the CPU judges whether there is an additional memory block or not in a step S4-6. If there is an additional memory block, the CPU returns to the step S4-2.

If the additional memory block has not been selected, the CPU judges whether it is during the timeout period in a step S4-2. If it is during the timeout period, the CPU returns to the step S4-3, and performs again the additional memory block address and erase command writing operation.

When the timeout period comes to an end ("NO" in the step S4-2), an erasing operation is collectively performed for the memory blocks designated by the memory block address signals latched with the erase command signals during the timeout period in a step S4-7, thereby ending the erasing operation mode.

Figure 9:
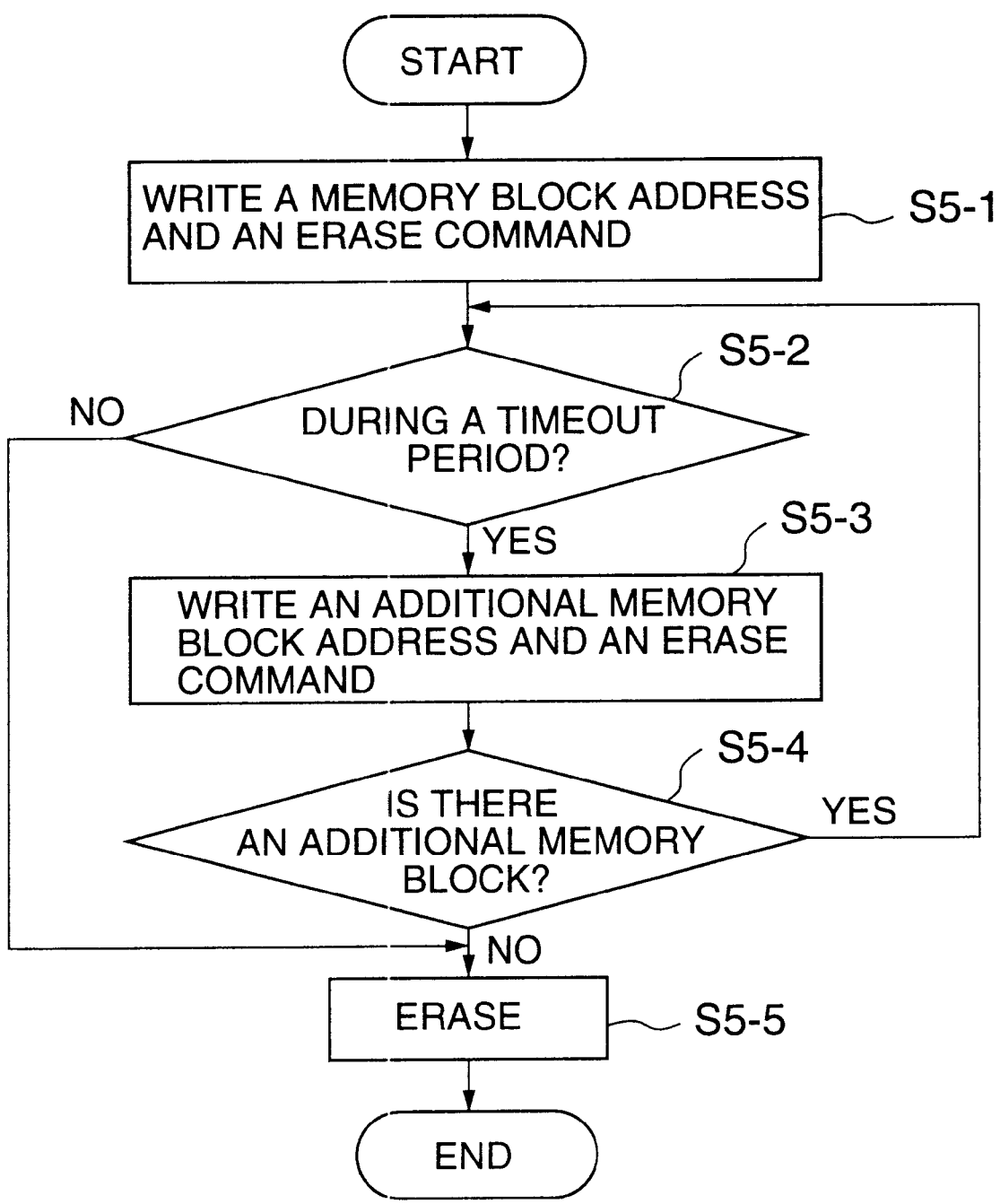
FIG. 9 is a flowchart of a second example operation of a CPU which transmits an address signal and a command signal in a non-volatile semiconductor memory device of the present invention in an erasing operation mode.

FIG. 9 is a flowchart of an operation in a case where the CPU does not need to check whether a memory block designated as an erase object memory block has been selected or not in the erasing operation mode. It should be understood here that a step S5-5 is an operation performed by one embodiment of the non-volatile semiconductor memory device of the present invention.

In this example operation, the CPU in the erasing operation mode first supplies a memory block address signal and an erase command signal to the non-volatile semiconductor memory device so as to perform a first memory block address and erase command writing operation in a step S5-1.

After the control circuit 15 latches the erase command signal, the timer 14 is started, indicating that a timeout period during which an additional memory block address and erase command writing operation can be performed has started. If there is an additional memory block address, the CPU judges whether it is during the timeout period or not in a step S5-2. If it is, the CPU supplies another memory block address signal and erase command signal to the non-volatile semiconductor memory device so as to perform an additional memory block address and erase command writing operation in a step S5-3. Since the CPU does not need to check on the erase object memory block selection notifying signal S18, the CPU judges whether there is an additional memory block or not in a step S5-4. If there is an additional memory block address, the step S5-2 and the step S5-3 are repeated again. When the timeout period comes to an end ("NO" in the step S5-2), an erasing operation is collectively performed for the memory blocks designated as the erase object memory blocks in a step 5-5, thereby ending the erasing operation mode.

As described so far, according to the present invention, the CPU confirms whether a memory block designated as an erase object block has been actually selected as an erase object memory block prior to the erasing operation. As for a memory block which has not been selected, it is possible to designate the memory block again prior to the erasing operation. In this manner, the period of time required for checking whether memory blocks designated as erase object memory blocks have actually been selected as erase object memory blocks can be shortened. Also, there is no need to perform a new erasing operation for memory blocks which have not been selected at first, but one collective erasing operation can suffice for all memory blocks that have been designated as erase object memory blocks. Thus, the erasing operation mode period can be considerably shortened.

The present invention is not limited to the specifically disclosed embodiments, but variations and modifications may be made without departing from the scope of the present invention.

The present application is based on Japanese priority application No. 10-371765, filed on Dec. 28, 1998, the entire contents of which are hereby incorporated for reference.

What is claimed is:

1. A non-volatile semiconductor memory device comprising:
    a plurality of memory blocks in which electrically erasable and writable non-volatile memory cells are arranged;
    an erase object memory block selection circuit which selects memory blocks designated as erase object memory blocks by an address and command signal transmitter; and
    an erase object memory block selection notifying circuit which notifies the address and command signal transmitter whether the erase object memory block selection circuit has selected the memory blocks designated by the address and command signal transmitter or not, an erasing operation being performed for the memory blocks selected by the erase object memory block selection circuit.

2. The non-volatile semiconductor memory device as claimed in claim 1, wherein the erase object memory block selection notifying circuit comprises:
    an erase object memory block selection judgement circuit which judges whether the erase object memory block selection circuit has selected the memory blocks designated as the erase object memory blocks by the address and command signal transmitter; and
    an erase object memory block selection notifying signal output circuit which outputs an erase object memory block selection notifying signal based on a judgement result from the erase object memory block selection judgement circuit.

3. The non-volatile semiconductor memory device as claimed in claim 2, further comprising:
    a timer which performs a timer operation for a predetermined period of time when started or reset, outputs a first logic level while performing the timer operation, and outputs a second logic level while not performing the timer operation; and
    a control circuit which, in an erasing operation mode, starts the timer when latching a first erase command signal supplied from the address and command signal transmitter, and resets the timer when latching an additional erase command signal supplied from the address and command signal transmitter,
    wherein:
        the erase object memory block selection circuit outputs a memory block latch signal indicating whether a memory block designated by a memory block address signal supplied from the address and command signal transmitter has been actually selected or not; and
        the erase object memory block selection judgement circuit outputs an erase command selection judgement signal as the judgement result by logically processing the output of the timer and the memory block latch signal.

4. The non-volatile semiconductor memory device as claimed in claim 3, wherein the erase object memory block selection circuit comprises:
    an address latch circuit which latches the memory block address signal supplied from the address and command signal transmitter;
    a block decoder which decodes the memory block address signal latched by the address latch circuit so as to select an erase object memory block; and
    a plurality of block latch circuits disposed in correspondence with the plurality of memory blocks, each of the block latch circuits latching information on whether each corresponding memory block has been selected by the block decoder, and each of the block latch circuits outputting the memory block latch signal that is information on whether each corresponding memory block has been selected by the block decoder while the block decoder selects at least one of the corresponding memory blocks.

5. The non-volatile semiconductor memory device as claimed in claim 4, wherein the control circuit controls the address latch circuit to latch a memory block address signal at the timing of falling of a write enable signal supplied from the address and command signal transmitter or a chip enable signal supplied from the address and command signal transmitter, whichever is the later signal, and latches an erase command signal and starts or resets the timer at the timing of rising of the write enable signal or the chip enable signal, whichever is the earlier signal.

6. The non-volatile semiconductor memory device as claimed in claim 3, wherein the erase object memory block selection notifying signal output circuit outputs an erase object memory block selection judgement signal as the erase object memory block selection notifying signal in synchronization with an output enable signal supplied from the address and command signal transmitter.

7. A method of performing an erasing operation in a non-volatile semiconductor memory device which comprises:

a plurality of memory blocks in which electrically erasable and writable non-volatile memory cells are arranged; and an erase object memory block selection circuit which selects a memory block designated as an erase object memory block by an address and command signal transmitter, the erasing operation being performed for memory blocks selected by the erase object memory block selection circuit, said method comprising the step of notifying the address and command signal transmitter whether memory blocks designated by the address and command signal transmitter have been actually selected as erase object memory blocks.

\* \* \* \* \*